United States Patent [19]
Takai et al.

[11] Patent Number: 5,818,151
[45] Date of Patent: Oct. 6, 1998

[54] ELECTRODE FOR ELECTRONIC COMPONENT

[75] Inventors: Hitto Takai, Toyama-ken; Shushi Saoshita, Toyama, both of Japan

[73] Assignee: Murata Manufacturing Co., Ltd., Japan

[21] Appl. No.: 600,444

[22] Filed: Feb. 13, 1996

[ * ] Notice: This patent issued on a continued prosecution application filed under 37 CFR 1.53(d), and is subject to the twenty year patent term provisions of 35 U.S.C. 154(a)(2).

[30] Foreign Application Priority Data

Feb. 14, 1995 [JP] Japan ................................ 7-024964

[51] Int. Cl.$^6$ ................................................ H01L 41/08
[52] U.S. Cl. ............................................................ 310/364
[58] Field of Search .................................... 310/311, 364, 310/363, 365, 366

[56] References Cited

U.S. PATENT DOCUMENTS

| | | | |
|---|---|---|---|
| 3,481,014 | 12/1969 | Noren | 310/364 X |
| 3,891,873 | 6/1975 | Yanagisawa et al. | 310/364 |
| 4,259,607 | 3/1981 | Noguchi et al. | 310/364 |
| 4,367,408 | 1/1983 | Imai et al. | 250/338 |

FOREIGN PATENT DOCUMENTS

| | | | |
|---|---|---|---|
| 2827654 | 1/1979 | Germany | 310/364 |
| 0132187 | 10/1979 | Japan | 310/364 |

*Primary Examiner*—Mark O. Budd
*Attorney, Agent, or Firm*—Ostrolenk, Faber, Gerb & Soffen, LLP

[57] ABSTRACT

An electrode for an electronic component includes a nickel-chrome alloy layer located on a surface of the electronic component, and a copper layer located on the nickel-chrome alloy layer. The electrode can be adapted to be used as a vibrating electrode of a piezoelectric device.

8 Claims, 2 Drawing Sheets

ELECTRODE FOR ELECTRONIC
COMPONENT

BACKGROUND OF THE INVENTION

1. Field of the Invention

The present invention relates to an electrode for an electronic component, and more specifically, to an electrode for an electronic component which is connected to a conductive pattern via solder.

2. Description of Related Art

A conventional electrode for an electronic component has a structure shown in FIG. 4. The electronic component may comprise, for example, the piezoelectric component 1 shown in FIG. 4 which includes a piezoelectric element 5 comprising a piezoelectric substrate 6 having a pair of vibrating electrodes 7 which are located on front and back surfaces thereof so as to be partially opposed to each other at a central portion of the substrate 6. A pair of cover members 8 are located on upper and lower major surfaces of the piezoelectric substrate 6, respectively, so as to complete the piezoelectric component, define a vibration space for allowing a resonance portion of the substrate 6 to resonate uninhibited and to reinforce the piezoelectric substrate 6.

A pair of external electrodes 2 are located on both end surfaces of the electronic component 1. The external electrodes 2 are preferably located on end surfaces of the piezoelectric substrate 6 and the pair of cover members 8. The external electrodes 2 are adapted and located to allow the electronic component 1 to be connected to a conductive pattern on a printed circuit board (not shown in FIG. 4) with solder.

The external electrode 2 comprises a copper layer 3 having a thickness of about 1.2 μm located in direct contact with the end surfaces of the cover members 8 and the piezoelectric substrate 6. The external electrode may be formed on the electronic component by a sputtering method or some other suitable electrode forming method. A silver layer 4 having a thickness of about 0.5 μm is located on the copper layer 3 and forms an external surface of the electrode. The silver layer 4 prevents oxidation of an outer surface of the copper layer 3.

Because copper is relatively inexpensive, copper is often used to form an external electrode. However, because copper is easily diffusible into solder and easily dissolved by solder, using copper as an external electrode results in the copper layer having a substantially reduced thickness. More specifically, in order to connect the electronic component 1 to the conductive pattern, a layer of solder is added to each of the external electrodes 2 usually on an entire outer surface of the external electrodes 2. When the solder layer is added to the external electrodes 2, the solder dissolves the outer silver layer 4 and spreads out and through the silver layer 4 so as to penetrate into the copper layer. As a result, the copper layer becomes substantially thinner and mixes with the solder. Often, solder will mix with the copper such that the solder is in direct contact with an end portion of the vibrating electrode 7. Because solder has an inferior conductivity, the solder does not provide an adequate electrical connection between the vibrating electrode 7 and the conductive pattern on the printed circuit board. Further, in extreme cases, the copper layer 3 is easily peeled or removed from the electronic component 1 so that the electronic component 1 is no longer electrically connected to the conductive pattern on the printed circuit board.

In order to avoid the above problems, another conventional electrode structure shown in FIG. 5 has been proposed. FIG. 5, wherein like reference numerals indicate the same structural elements as in FIG. 4, shows a structure having an external electrode 10 located on the end surfaces of the piezoelectric substrate 6 and the cover members 8. The external electrode 10 comprises a nickel-copper alloy layer 9 having a thickness of about 0.15 μm formed on the end surfaces of the component 1 by a sputtering process. A copper layer 3 is located on the nickel-copper alloy layer 9 and a silver layer 4 is located on the copper layer 3.

The nickel-copper alloy layer 9 is provided for the purpose of preventing the solder from penetrating through the silver layer 4 and the copper layer 3 to be in direct contact with the end surfaces of the electronic component 1, and especially, the end surfaces of the vibrating electrodes 7. This result is thought to be achieved because nickel is not easily dissolved by solder.

However, even if an electrode 10 having the nickel-copper layer 9 is used, some amount of solder still penetrates though the nickel-copper alloy layer 9 and directly contacts the end surfaces of the electronic component 1, and especially, the vibrating electrodes 7 thereby preventing the electronic component 1 from being electrically connected to the conductive pattern on the printed circuit board. In addition, such an electrode 10 still does not provide sufficient resistance against thermal shock and sufficient heat resistance which weakens the bond between the external electrodes 10 and the electronic component 1 resulting in the external electrodes 10 being easily peeled or removed from the electronic component 1.

SUMMARY OF THE INVENTION

The preferred embodiments of the present invention provide a reliable electrode for an electronic component, the electrode being adapted to prevent diffusion of solder into a copper layer and to increase the resistance to heat shock and increase the thermal resistance of the electrode.

The electrode for an electronic component according to the preferred embodiments of the present invention includes an electronic component having at least one exterior surface, a nickel-chrome alloy layer being located on the exterior surface and a copper layer being located on the nickel-chrome alloy layer for electrically connecting the electronic component to a conductive pattern on a printed circuit board. Further, the electrode comprises a silver layer being located on the copper layer. Furthermore, the electrode for an electronic component according to the preferred embodiments of the present invention may also be used as a piezoelectric vibrating electrode.

The foregoing and other objects, features, aspects and advantages of the preferred embodiments of the present invention will be apparent from the following description of the preferred embodiments of the present invention, taken in conjunction with the accompanying drawings.

For the purpose of illustrating the invention, there is shown in the drawings several forms which are presently preferred, it being understood, however, that the preferred embodiments of the present invention are not limited to the precise arrangements and instrumentalities shown.

DETAILED DESCRIPTION OF PREFERRED EMBODIMENTS

Figure 1:
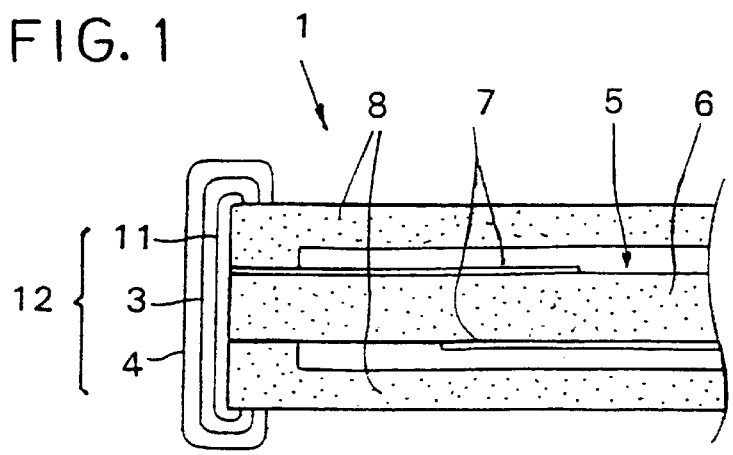
FIG. 1 shows a partial cross-sectional view of a piezoelectric component having an external electrode according to a preferred embodiment of the present invention.

FIG. 1 is a partial cross-sectional view showing an electrode for an electronic component according to one preferred embodiment of the present invention. This preferred embodiment is an improvement of the conventional electrode for an electronic component shown in FIGS. 4 and 5. Therefore, common reference numerals in FIG. 1 represent common components shown in FIGS. 4 and 5.

Referring to FIG. 1, a piezoelectric component 1 comprises a piezoelectric element 5, a pair of cover members 8 and a pair of external electrodes 12. The piezoelectric element 5 includes a piezoelectric substrate 6 preferably formed of a suitable piezoelectric ceramic material having a pair of vibrating electrodes 7 which are located on front and back surfaces thereof so as to be partially opposed to each other at a central portion of the substrate 6. A pair of cover members 8 are located and adhered on the upper and lower major surfaces of piezoelectric substrate 6 with adhesive, respectively, so as to complete the piezoelectric component, define a vibration space for allowing a resonance portion of the substrate 6 to resonate uninhibited and to reinforce the piezoelectric substrate 6. The cover members 8 each comprise a substantially U-shaped member to prevent the vibrating resonance portion of the piezoelectric substrate 6 from contacting the cover members 8.

A pair of external electrodes 12 are located on both end surfaces (only one shown in FIG. 1) of the electronic component 1. The external electrodes 12 are preferably formed on the end surfaces of the piezoelectric substrate 6 and the pair of cover members 8, to allow the electronic component 1 to be connected to a conductive pattern on a printed circuit board (not shown in FIG. 1) with solder.

The external electrode 12 comprises a nickel-chrome alloy layer 11 preferably having a thickness of about 0.15 $\mu$m formed so as to directly contact the end surfaces of the electronic component 1 by a sputtering method or some other suitable method. The external electrode 12 also includes a copper layer 3 preferably having a thickness of about 0.21 $\mu$m and being located on the nickel-chrome alloy layer 11. A silver layer 4 preferably having a thickness of about 0.18 $\mu$m is located on the copper layer 3 to prevent the outer surface of the copper layer 3 from being oxidized. The three layers 3, 4 and 11 are preferably formed by a non-magnetic sputtering equipment or some other suitable electrode forming method.

In an additional preferred embodiment, the nickel-chrome alloy layer 11 preferably comprises about 93% of nickel and about 7% of chrome, wherein the percentages refer to the weight of the two materials.

Figure 2:
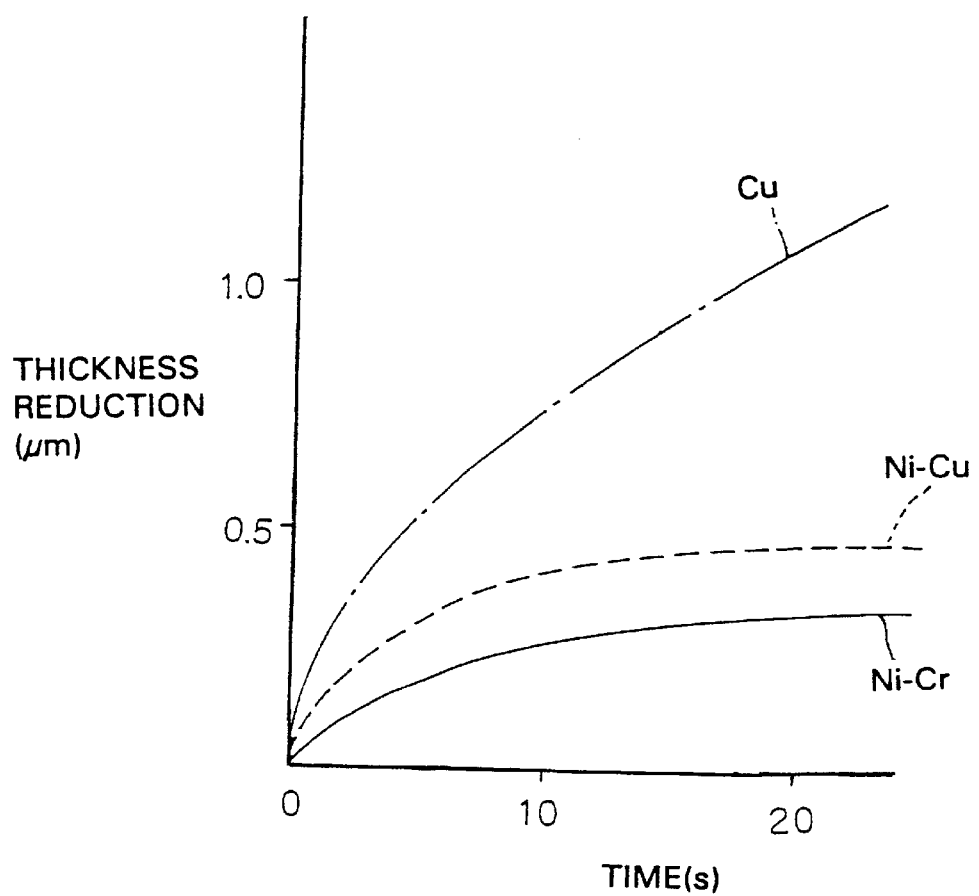
FIG. 2 shows a comparison of the characteristic of the electrodes according to the preferred embodiment of the present invention shown in FIG. 1 and a prior art electrode.

The above-noted preferred embodiment comprising about 93% of nickel and about 7% of chrome was tested with the results of the tests being shown in FIG. 2. Referring to FIG. 2, the solid line represents the test results of an electronic component having an electrode 12 according to the above-described preferred embodiment including the nickel-chrome alloy layer 11, the copper layer 3 and the silver layer 4. The dotted line in FIG. 2 represents the test results of an electronic component having the conventional electrode 10 shown in FIG. 5 including the nickel-copper alloy layer 9, the copper layer 3 and the silver layer 4. The dot-dash line represents the test results of an electronic component having the conventional electrode 2 shown in FIG. 4 including the copper layer 3 and the silver layer 4.

To test the three electrodes discussed above, each component having the electrode according to the above-described preferred embodiment and the two conventional electrodes was immersed into melting solder at a temperature of about 350° C. to test an amount of diffusion by measuring a reduction in the thickness of the copper layer 3 (in $\mu$m) caused by the diffusion of solder into the respective electrode over time (in seconds). As shown in FIG. 2, each of the respective electrodes 12 (solid line), 8 (dotted line) and 2 (dot-dash line) had a reduction in the thickness of the copper layer 3 caused by spreading and diffusing of solder into the respective electrode, of about 0.3 $\mu$m, 0.45 $\mu$m and greater than 1.0 $\mu$m, respectively. According to the test results shown in FIG. 2, it is clear that the electrode 12 according to the preferred embodiment described above achieves a reduced amount of diffusion of the solder into the electrode 12 as compared with the conventional electrodes 2 and 10 shown in FIGS. 4 and 5, respectively.

Further, because the electrode 12 of the above-described preferred embodiment achieves a reduced diffusion of solder, the heat resistance and resistance to thermal shock of the electrode 12 are substantially improved.

Figure 4:
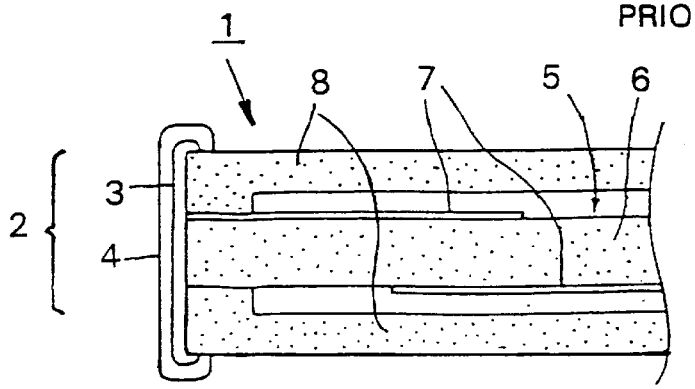
FIG. 4 shows a partial cross-sectional view of a piezoelectric component having a conventional external electrode.
Figure 5:
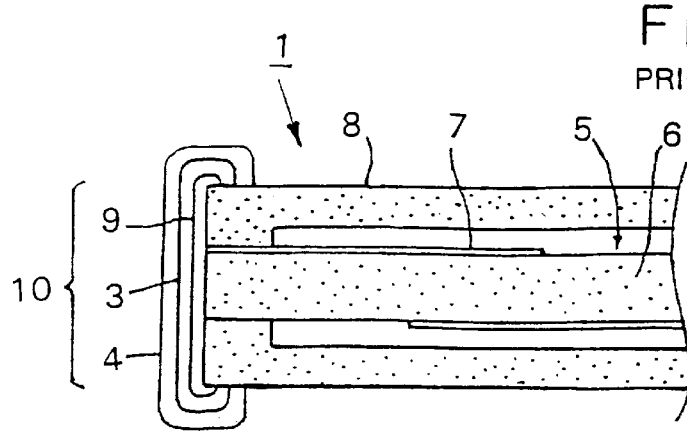
FIG. 5 shows a partial cross-sectional view of a piezoelectric component having another conventional external electrode.

Subsequently, each component having the electrodes 12, 2 and 10 corresponding to the above-noted preferred embodiment of the present invention, the conventional electrode shown in FIG. 4 and the conventional electrode 10 shown in FIG. 5, respectively, was tested for resistance to thermal shock at a temperature between the range of –40° C. and 125° C. The results of the test are expressed in a ratio of the number of components that failed (unable to withstand the thermal shock) to the total number of components tested. The ratios resulting from the test are as follows: 0/30 for the above-noted preferred embodiment of the present invention, 26/30 for the conventional electrode 2 shown in FIG. 4 and 4/30 the conventional electrode 10 shown in FIG. 5. Thus, it is clear that the electrode 12 of the above-described preferred embodiment achieved substantially increased resistance to thermal shock.

In further testing, the inventor confirmed that using a pure chrome layer in place of the nickel-chrome alloy layer 11 shown in FIG. 2 is better for avoiding diffusion of solder. However, because a pure chrome layer does not bond easily with ceramic materials, a pure chrome layer is not desirable for use as an electrode. In fact, it has been long been known that pure chrome does not bond well with ceramic materials. Accordingly, it was previously thought that chrome can not be used to form an electrode because using a chrome layer to form an electrode causes the electrode to be easily peeled or removed from the piezoelectric substrate.

However, the inventor determined that chrome, when used with nickel to form a layer of nickel-chrome alloy and combined with a layer of copper, forms an excellent electrode because the chrome decreases the amount of diffusion of solder into the copper layer of the electrode while increasing the resistance to thermal shock and thermal resistance. By combining the chrome with nickel to form a nickel-chrome alloy, the inventor determined that the nickel would enable the nickel-chrome alloy layer to have sufficient bonding capability to form a sufficiently strong bond with the ceramic material of the electronic component.

Although the present invention has been described with regard to the preferred embodiments above, it is to be noted that the electrode according to the preferred embodiments of the present invention can be used with other electronic components, such as a capacitor, a resistor, a transistor or other suitable electronic components.

Figure 3:
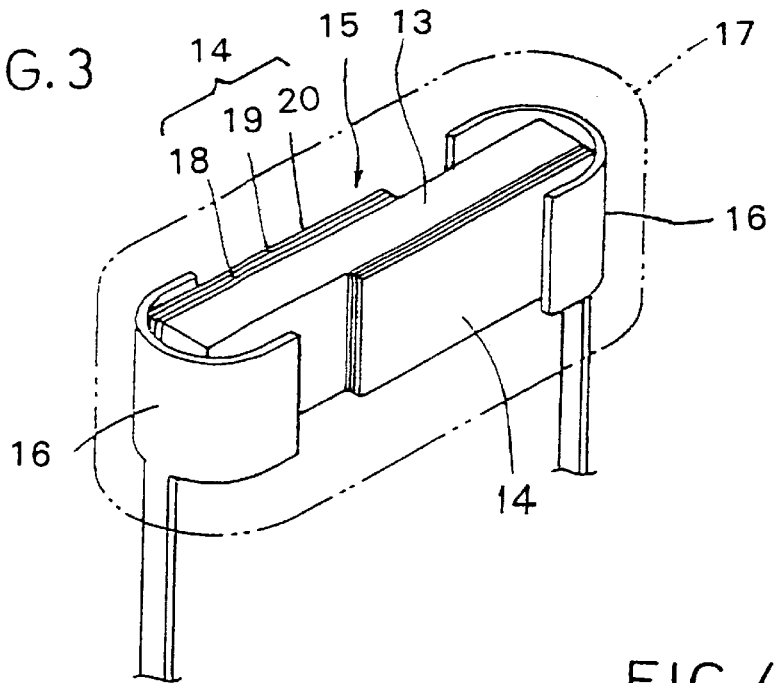
FIG. 3 shows a perspective view of another preferred embodiment of the present invention.

FIG. 3 is a perspective view of another preferred embodiment wherein an electrode is adapted to function as a piezoelectric vibrating electrode. The piezoelectric component shown in FIG. 3 comprises a piezoelectric element 15, a pair of U-shaped terminals 16, and a resin member 17. The piezoelectric element 15 includes a piezoelectric substrate 13 having a pair of vibrating electrodes 14 which are located on front and back surfaces thereof so as to be partially opposed to each other at a central portion of the substrate 13. The pair of U-shaped terminals 16 are located at both end surfaces of the piezoelectric substrate 13. Each of the terminals 16 is connected to an end portion of the substrate 12 via conductive material, such as solder, to connect the piezoelectric element 15 to a conductive pattern on a circuit board (not shown in FIG. 3). The resin member 17 is preferably made of thermosetting resin, such as epoxy resin, and is provided to surround the piezoelectric component 15.

Each of the pair of vibrating electrodes 14 comprises a nickel-chrome alloy layer 18 located on one of the major surfaces of the piezoelectric substrate 13. The nickel-chrome alloy layer 18 forms a first layer of the electrode 14. A copper layer 19 is located on the nickel-chrome alloy layer 18 so as to be electrically connected to the U-shaped terminals 16. A silver layer 20 is located on the copper layer 19 to prevent the copper layer 19 from being oxidized. The three layers 17, 18 and 19 are preferably formed by a non-magnetic sputtering equipment.

As mentioned above, the electrode of the preferred embodiments of the present invention can be applied to form not only an external electrode but also to form a vibrating electrode. When applied to form the vibrating electrode, the same benefits and improved results are achieved as with the case of the electrode forming an external electrode.

While preferred embodiments of the invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. An electrode located on an electronic component having at least one external surface, the electrode comprising:

a nickel-chrome alloy layer located on the at least one external surface of said electronic component, said nickel-chrome alloy layer comprising about 93% nickel and about 7% chrome; and a copper layer located on said nickel-chrome alloy layer to minimize the diffusion into said nickel-chrome alloy layer of any solder subsequently applied to said electrode.

2. An electrode for an electronic component in accordance with claim 1, further comprising a silver layer located on said copper layer and a solder layer located on said silver layer.

3. An electrode for an electronic component in accordance with claim 1, wherein said electronic component includes a piezoelectric substrate and said electrode forms a vibrating electrode located on the piezoelectric substrate.

4. An electrode for an electronic component in accordance with claim 3, further comprising a silver layer located on said vibrating electrode.

5. An electronic component comprising:

an electronic component body having at least one external surface;

an electrode located on the external surface of said electronic component body, the electrode including a nickel-chrome alloy layer located on the at least one external surface of said electronic component body, said nickel-chrome alloy layer comprising about 93% nickel and about 7% chrome; and a copper layer located on said nickel-chrome alloy layer to minimize the diffusion into said nickel-chrome alloy layer of any solder subsequently applied to said electrode.

6. An electronic component in accordance with claim 5, further comprising a silver layer located on said copper layer and a solder layer located on said silver layer.

7. An electronic component in accordance with claim 5, wherein said electronic component body includes a piezoelectric substrate and said electrode forms a vibrating electrode located on the piezoelectric substrate.

8. An electronic component in accordance with claim 7, further comprising a silver layer located on said vibrating electrode.

* * * * *